United States Patent
Zinke et al.

(10) Patent No.: US 10,270,413 B2
(45) Date of Patent: Apr. 23, 2019

(54) ADVANCED THERMALLY COMPENSATED SURFACE ACOUSTIC WAVE DEVICE AND FABRICATION

(71) Applicant: SOITEC, Bernin (FR)

(72) Inventors: Christophe Zinke, Grenoble (FR); Eric Desbonnets, Lumbin (FR)

(73) Assignee: Soitec, Bernin (FR)

( * ) Notice: Subject to any disclaimer, the term of this patent is extended or adjusted under 35 U.S.C. 154(b) by 618 days.

(21) Appl. No.: 14/782,548

(22) PCT Filed: Mar. 21, 2014

(86) PCT No.: PCT/EP2014/055746
§ 371 (c)(1),
(2) Date: Oct. 5, 2015

(87) PCT Pub. No.: WO2014/166722
PCT Pub. Date: Oct. 16, 2014

(65) Prior Publication Data
US 2016/0065162 A1    Mar. 3, 2016

(30) Foreign Application Priority Data

Apr. 8, 2013 (FR) ..................................... 13 00824

(51) Int. Cl.
*H01L 41/22* (2013.01)
*H03H 3/08* (2006.01)
*H03H 9/25* (2006.01)

(52) U.S. Cl.
CPC ................ *H03H 3/08* (2013.01); *H03H 9/25* (2013.01)

(58) Field of Classification Search
CPC ................................... H03H 2/01; H01L 41/22
USPC ......................................... 29/25.35; 28/25.35
See application file for complete search history.

(56) References Cited

U.S. PATENT DOCUMENTS

| | | |
|---|---|---|
| 5,923,231 A | 7/1999 | Ohkubo et al. |
| 2003/0122453 A1 | 7/2003 | Yamada et al. |
| 2004/0104640 A1 | 6/2004 | Wang et al. |
| 2004/0189146 A1 | 9/2004 | Ueda et al. |
| 2008/0094150 A1 | 4/2008 | Meister et al. |

(Continued)

FOREIGN PATENT DOCUMENTS

| | | |
|---|---|---|
| CN | 1926763 A | 3/2007 |
| CN | 102460968 A | 5/2012 |
| EP | 2058946 A1 | 5/2009 |

(Continued)

OTHER PUBLICATIONS

Hashimoto et al., Recent Development of Temperature Compensated SAW Devices, Ultrasonics Symposium, 20111 IEEE International, Oct. 18, 2011, pp. 79-86.

(Continued)

*Primary Examiner* — Thomas M Dougherty
(74) *Attorney, Agent, or Firm* — TraskBritt

(57) ABSTRACT

This disclosure relates to a method of fabrication of a surface acoustic wave device comprising the step (a) of providing a piezoelectric structure, the step (b) of providing a dielectric structure, wherein the step (b) comprises a step (b1) of metalizing the dielectric structure, and the method further comprising the step (c) of bonding the metalized dielectric structure to the piezoelectric structure.

16 Claims, 6 Drawing Sheets

(56) References Cited

U.S. PATENT DOCUMENTS

2009/0236935 A1* 9/2009 Kando ............... H03H 9/02055
310/313 R

FOREIGN PATENT DOCUMENTS

| EP | 2388840 | A2 | 11/2011 |
|----|---------|----|---------|
| JP | 1998-084247 | A | 3/1998 |
| JP | 1999-284162 | A | 10/1999 |
| JP | 2004-297693 | A | 10/2004 |
| JP | 2005-206576 | A | 8/2005 |
| JP | 2007-049482 | A | 2/2007 |
| JP | 2008-516490 | A | 5/2008 |
| JP | 2008220333 | A | 9/2008 |
| JP | 2008-546995 | A | 12/2008 |
| WO | 1996/004713 | A1 | 2/1996 |
| WO | 2002/082645 | A1 | 10/2002 |
| WO | 2013/031651 | A1 | 3/2013 |

OTHER PUBLICATIONS

International Search Report for International Application No. PCT/EP2014/055746 dated Apr. 11, 2014, 4 pages.
Chinese First Officce Action from Chinese Application No. 201480020179.5, dated Apr. 14, 2017, 10 pages.
Chinese Second Officce Action from Chinese Application No. 201480020179.5, dated Jan. 12, 2018, 8 pages.
Chinese Search Report from Chinese Application No. 201480020179.5, dated Apr. 14, 2017, 1 page.
International Writen Opinion from PCT International Application No. PCT/EP2014/055746, dated Oct. 8, 2015, 4 pages.
Japanese Notification of Reasons for Refusal for Japanese Application No. 2016-0506835 dated May 22, 2018, 6 pages.
Office Action received for European Patent Application No. 14711532.3, dated Mar. 23, 2017, 4 pages.

* cited by examiner

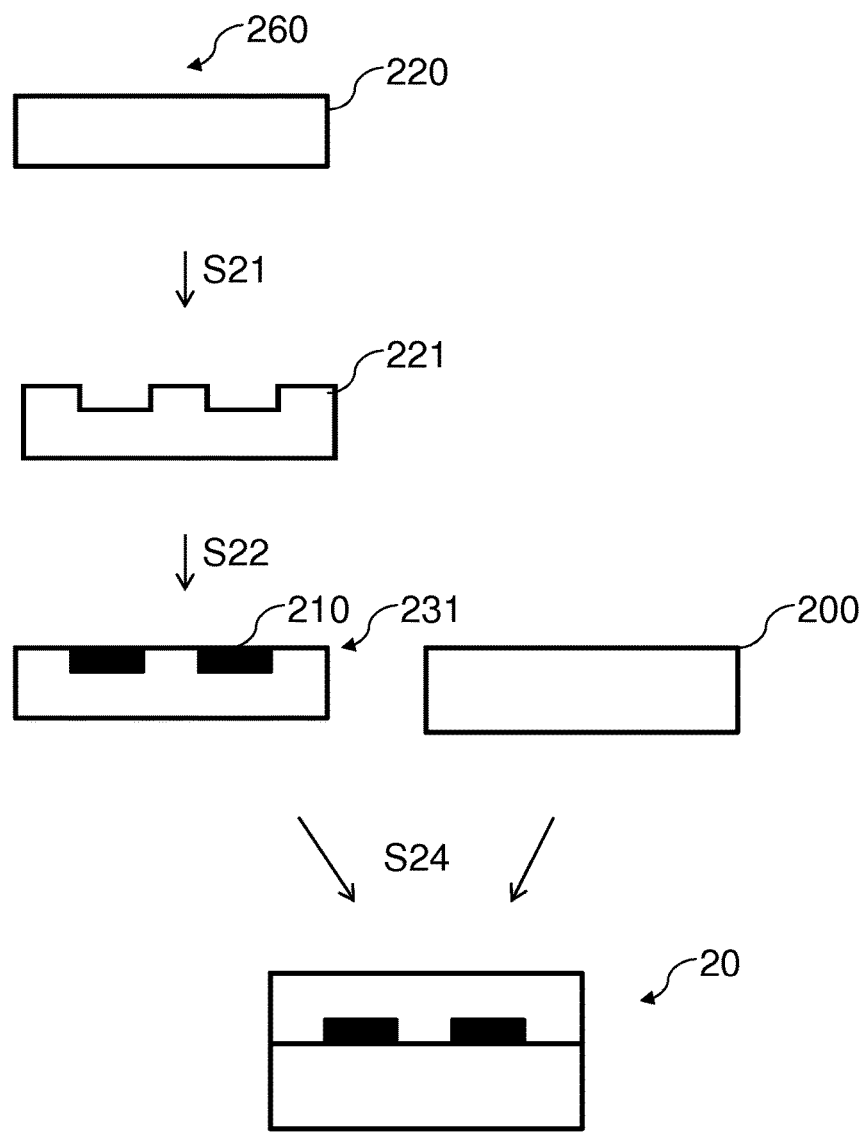

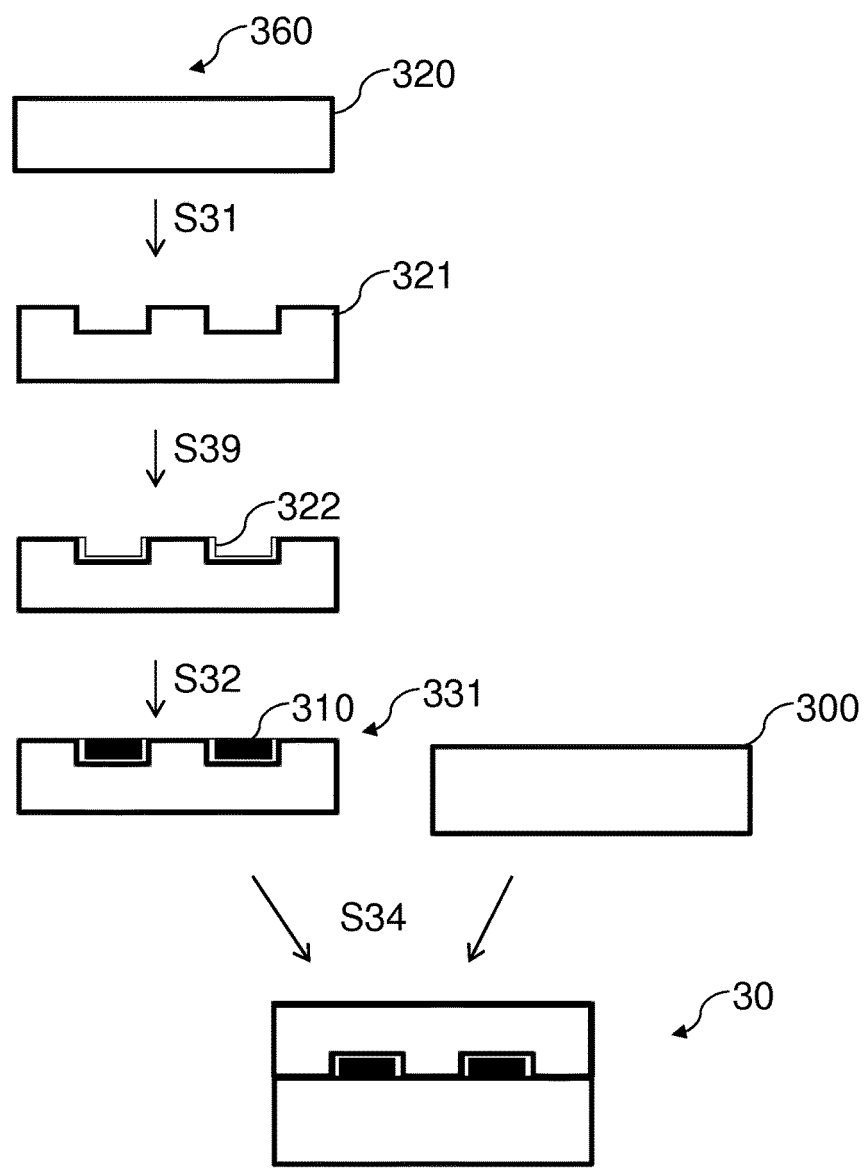

ADVANCED THERMALLY COMPENSATED SURFACE ACOUSTIC WAVE DEVICE AND FABRICATION

CROSS-REFERENCE TO RELATED APPLICATIONS

This application is a national phase entry under 35 U.S.C. § 371 of International Patent Application PCT/EP2014/055746, filed Mar. 21, 2014, designating the United States of America and published in English as International Patent Publication WO 2014/166722 A1 on Oct. 16, 2014, which claims the benefit under Article 8 of the Patent Cooperation Treaty and under 35 U.S.C. § 119(e) to French Patent Application Serial No. 13/00824, filed Apr. 8, 2013, the disclosure of each of which is hereby incorporated herein in its entirety by this reference.

TECHNICAL FIELD

This disclosure relates to a method of fabrication of a surface acoustic wave device and to a surface acoustic wave device.

BACKGROUND

Acoustic resonator structures such as surface acoustic wave (SAW) devices 10 use one or more interdigitated transducers (IDTs) 111 provided on a piezoelectric substrate 100 to convert electrical signals to acoustic waves and vice versa, as schematically illustrated in FIG. 1A. Such SAW devices or resonators are often used in filtering applications. Radio frequency (RF) SAW technology has excellent performances, such as high isolation and low insertion losses, and are widely used for RF duplexers (DPXs) in wireless communication applications. In order to be competitive over RF DPXs based on RF bulk acoustic wave (BAW) technology, the device performance of RF SAW devices has to be improved and, especially, the temperature stability of the frequency response is demanded.

The temperature dependence of the operating frequency of SAW devices, or the thermal coefficient of frequency (TCF), is not only dependent on the changes of the spacing, illustrated in FIG. 1A as spacing S, between the interdigitated fingers of the IDTs, which are generally due to the relatively high coefficient of thermal expansion (TCE) of the commonly used piezoelectric substrates, but depend also on the thermal coefficient of velocity (TCV), as an expansion or contraction of the piezoelectric substrate that comes along with an increase or decrease of the SAW velocity.

The recently published article by K. Hashimoto, M. Kadota, et al., "Recent Development of Temperature Compensated SAW Devices," IEEE Ultrason. Symp. 2011, pages 79-86, gives an overview of current approaches used to overcome the problem of temperature dependence of the frequency response of SAW devices, in particular, the approach of the $SiO_2$ overlay.

As shown schematically in FIG. 1B, the latter approach concerning the $SiO_2$ overlay comprises the step S12 of metalizing the piezoelectric substrate 100, leading to metalized parts 110, and the subsequent formation step S10 of a dielectric layer 120, in particular, an $SiO_2$ layer, onto the entire surface of the piezoelectric substrate 100 and the metalized parts 110. A further planarization step S13 may be performed, depending on whether one envisaged a SAW device with a convex top surface 101 or a SAW device with a flat top surface 102 as the final device. However, this approach is rather limited for several reasons. The choice of materials used for metalized parts 110 and the choice of deposition techniques used for these materials are restricted due to the compatibility requirement with the piezoelectric substrate 100, aiming for a good electrical (ohmic) contact. Further, the choice of materials used for the dielectric layer 120 covering the metalized parts 110 and the piezoelectric substrate 100, and the choice of deposition techniques used for that dielectric layer 120 are restricted because the thermal budget employed during the formation of the dielectric layer 120 has to be compatible with the material used for metalized parts 110 and the piezoelectric substrate 100 in order to avoid degradation of the piezoelectric properties, the degradation of the electrical properties of the metalized parts 110, or avoid diffusion of metal to either the piezoelectric substrate 100 or the dielectric layer 120 formed on top of the metalized structure. In addition, the rather high TCE of the commonly used piezoelectric substrates 100 can further cause manufacturing problems due to warping or bending or induced strain if several materials with different TCE are in contact with each other and the temperatures applied exceed the maximal tolerated limit, as may be the case for the metallization 110 formed on top of the piezoelectric substrate 100, and the thermal budget employed during the formation of the dielectric layer 120 may lead to delamination of the metalized parts 110 or even breakage of the wafer. Further, the formation of the dielectric layer 120 at rather low temperatures, as can be the case for certain amorphous $SiO_2$ layers, leads to rather low quality material with reduced acoustic properties and, thus, limits the performance of SAW technology based on it. Even further, unavoidable growth defects due to the deposition of the dielectric layer 120 on both the metalized parts 110 and the piezoelectric substrate 100, together with the fact that the metalized parts 110 comprise horizontal and vertical parts with respect to the growth direction of the dielectric layer 120, lead to parasitic electro-acoustic effects, especially at the intersections of the vertical and horizontal parts and, thus, losses of performance of the SAW device 10.

BRIEF SUMMARY

The object of the disclosure is to propose a device and a method of fabrication of a device obviating the above-mentioned detriments.

In particular, this disclosure relates to a method of fabrication of a surface acoustic wave device comprising steps of (a) providing a piezoelectric structure, (b) providing a dielectric structure, the step (b) comprising a step (b1) of metalizing the dielectric structure, and the method further comprising a step (c) of bonding the metalized dielectric structure to the piezoelectric structure.

This method of fabrication has the advantage that the dielectric structure can be provided in a separate process to the providing of the piezoelectric structure and, thus, certain incompatibilities can be avoided. For instance, one is no longer limited to dielectric materials suitable for deposition on a piezoelectric material but has a much larger choice. Further, as the metallization is performed on the dielectric structure and not the inverse, dielectric materials sustaining high formation temperature may be used, such as, for instance, thermally grown silicon oxide, because there is no risk of diffusion of metal as it is formed in an ulterior step. Such high quality dielectric materials also allow a much better control of the metallization and, in particular, a much better control of the interface between the dielectric structure and the metalized parts, thus avoiding parasitic effects causing perturbation of the surface acoustic waves. Further, to the mentioned advantages, the thermal compensation of the surface acoustic wave device allowing a much higher thermal stability of its frequency response is obtained due to the stiffening provided by the dielectric structure and its counteracting TCE.

In a further advantageous embodiment, the step (b1) is performed so as to form an interdigitated electrode structure.

This provides the beneficial advantage that the pattern of the interdigitated electrode structure and, thus, its structural features like, for instance, its spacing, can be chosen adequately for the desired frequency range of the surface acoustic wave device.

In a further advantageous embodiment, the interdigitated electrode structure has a spacing lower than 100 nm, and the dielectric structure shows a dielectric constant suitable for allowing a breakdown voltage of higher than 100 V.

This embodiment provides the beneficial effect that a much better control of the metallization leads to a better definition of its pattern and allows well-defined frequency response of the surface acoustic wave device. The use of well-suited dielectric materials allows reduction of the spacing S of the interdigitated electrode structure and the adaptation of the surface acoustic wave device for high power application, in particular, by using high k dielectric materials.

In a further advantageous embodiment, the step (b1) is performed by metal deposition and the step (b) comprises a step of forming a dielectric layer prior to the metal deposition at a formation temperature, the formation temperature being greater than the diffusion temperature of the deposited metal in either the dielectric layer or the piezoelectric structure, in particular, the formation temperature being greater than 350° C., preferably greater than 850° C., more preferably greater than 1200° C.

This provides the beneficial advantage that much higher temperatures can be used for the formation of the dielectric layer, which would have been incompatible with the process flow of the prior art due to the metal diffusion.

In a further advantageous embodiment, the deposited metal may be chosen among the group of Au, Pt, Cu, Al, Mo, and W.

This provides the beneficial advantage that one can use materials for the metallization that would have been incompatible with the direct deposition on the piezoelectric structure.

In a further advantageous embodiment, the dielectric structure comprises a dielectric layer, the dielectric layer being made of a material chosen among the group of materials of $SiO_2$, SiN, SiON, SiOC, SiC, DLC, or alumina.

This provides the beneficial advantage that one can use well-known materials, the process flow allowing the use of elaboration techniques and formation temperatures that would have been incompatible with the direct deposition on the piezoelectric structure.

In a further advantageous embodiment, the dielectric structure comprises a dielectric layer, the dielectric layer is a thermally grown silicon oxide formed at temperatures higher than 800° C., preferentially higher than 1050° C.

This provides the beneficial advantage that extremely high temperatures can be used for the formation of that high quality dielectric material, which would have been deteriorating the piezoelectric properties of the piezoelectric material if directly applied on it.

In a further advantageous embodiment, the dielectric structure comprises a dielectric layer, the dielectric layer being made of a high k dielectric material, preferentially among hafnium silicate, zirconium silicate, hafnium dioxide, and zirconium dioxide.

This embodiment provides the beneficial effect that one can properly choose the suitable material for the dielectric material depending on the application, for instance, high power application, and the quality of the interface needed.

In a further advantageous embodiment, the step (b1) comprises the following steps of locally etching cavities in a surface of the dielectric structure and depositing metal in the cavities.

This provides the beneficial advantage that the well-controlled process of etching and metallization, known and well developed by semiconductor and microelectronic industries, lead to a much better control of the interface between the dielectric material and the metalized parts.

In a further advantageous embodiment, the step (b1) further comprises the step of formation of a passivation layer prior to the metal deposition in the cavities and after locally etching cavities in the surface of the dielectric structure.

This provides the beneficial advantage that the passivation allows the control of corrosion resistance but may also provide a barrier to diffusion of the metal.

In a further advantageous embodiment, the step (b1) further comprises the step (b2) of providing a flush surface between the metal deposited in the cavities and the non-etched parts of the dielectric structure, the step (b2) being preferably performed by polishing and/or etching of the protruding part of either the dielectric structure or the metal deposited.

This provides the beneficial advantage that the flush surface can be prepared with high quality, which allows a perfect bonding interface between the metalized parts and the dielectric material and the piezoelectric structure, necessary for optimized propagation of the surface acoustic wave that is confined close to that interface.

In a further advantageous embodiment, the step (b1) further comprises the step of providing a leveling layer in a flush manner to either the protruding part of the deposited metal or the protruding part of the dielectric structure.

This provides the beneficial advantage that the leveling layer may optimize the propagation of the surface acoustic wave and, thus, increase the performance of the surface acoustic wave device due to an optimized electromechanical coupling.

In a further advantageous embodiment, the dielectric structure comprises a donor substrate, a dielectric layer formed on the donor substrate, the method further comprising the step (c1) of transferring the dielectric layer onto the piezoelectric structure after performing step (b1).

This provides the beneficial advantage that a dielectric layer may be provided as part of a donor structure that may be reused several times, thus increasing manufacturing performance.

In a further advantageous embodiment, a step of forming a zone of weakness in either the donor substrate or the dielectric layer prior to bonding, and the transfer comprises a step of detaching the dielectric layer from the donor substrate at the zone of weakness after step (c).

This provides the beneficial advantage that such a process allows the production of a surface acoustic wave device with convex or flat top dielectric in an easily manageable process flow, thus gaining production output.

In a further advantageous embodiment, the step (c1) comprises polishing and/or etching of the donor substrate after step (c).

This provides the beneficial advantage that such a process allows another way of production of surface acoustic wave device with convex or flat top dielectric in an easily manageable process flow, thus gaining production output.

In further advantageous embodiments, the method further comprises a step of laying open at least part of the metalized dielectric structure after step (c) is performed.

This provides the beneficial advantage that a surface acoustic wave device is obtained and electrically addressable, for instance, for testing in the production line.

This disclosure also relates to a surface acoustic wave device comprising a piezoelectric structure, a dielectric layer having metalized parts on the piezoelectric structure, wherein the dielectric layer has a formation temperature higher than the diffusion temperature of the metal, either to the dielectric layer or the piezoelectric structure.

This provides the beneficial advantage that a thermally compensated surface acoustic wave device is obtained with a high quality dielectric and a high quality interface between the metalized parts and the dielectric layer, and also a high quality interface region for proper acoustic wave propagation.

In a further advantageous embodiment, the dielectric layer shows a dielectric constant suitable for allowing a breakdown voltage of higher than 50 V, preferentially higher than 100 V.

This provides the beneficial advantage that the surface acoustic wave device can be used for high power applications, together with very low insertion losses.

BRIEF DESCRIPTION OF THE DRAWINGS

The disclosure will be described in more detail by way of example hereinafter using advantageous embodiments and with reference to the drawings. The described embodiments are only possible configurations in which the individual features may, however, as described above, be implemented independently of each other or may be omitted. Equal elements illustrated in the drawings are provided with reference identifications, wherein the first number depicts the number of the figure, the second and third number depicts the element to be considered, an optional fourth number is added if alternatives occur within the same figure, and even a fifth number is added if several modes within an alternative occur. For steps, an additional S at the beginning is added. Parts of the description relating to equal elements or steps illustrated in the different drawings may be left out.

FIGS. 2 through 6B schematically illustrate a fabrication method of an acoustic resonator structure and an acoustic resonator structure in accordance with embodiments of this disclosure.

DETAILED DESCRIPTION

Figure 1A:
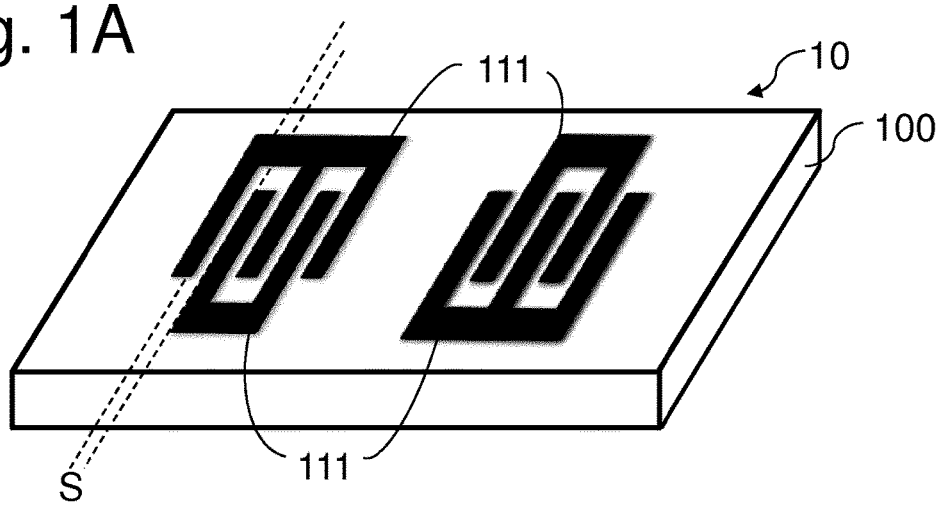
FIG. 1A (already discussed) schematically illustrates a SAW device with interdigitated transducers (IDTs) without overlay layer.

This disclosure will now be described with reference to specific embodiments. It will be apparent to the skilled person that features and alternatives from any of the embodiments can be combined, independently of each other, with features and alternatives of any other embodiment in accordance with the scope of the claims.

FIG. 2 schematically shows a fabrication method of a SAW device 20 in accordance with embodiments of this disclosure. An etching step S21 is performed on a dielectric structure 260 comprising a dielectric layer 220, which results in an etched dielectric layer 221 including etched and non-etched parts. A subsequent metallization step S22 is performed to fill up in a flush manner the etched parts of the etched dielectric layer 221 with metalized parts 210, resulting in a metalized dielectric layer structure 231 comprising a dielectric layer 220 comprising electrically conductive means, in particular, metalized parts 210. After the formation of the metalized dielectric layer structure 231, the metalized dielectric layer structure 231 is assembled on a piezoelectric structure 200, in particular, via a bonding step S24, and, thus, forms the SAW device 20. The piezoelectric structure 200 may be a single crystal piezoelectric material or also a thin layer of piezoelectric material on a host substrate. Preferentially, the piezoelectric material is lithium niobate or lithium tantalate, but this disclosure is not limited to it and any material of suitable electromechanical coupling could be used. The host substrate may be adapted in TCE to the piezoelectric material in order to improve the thermal stabilization of the frequency response by counteracting the thermal response of the latter. The piezoelectric material may be transferred by SMARTCUT® to the host substrate, but could also be epitaxially grown.

Figure 1B:
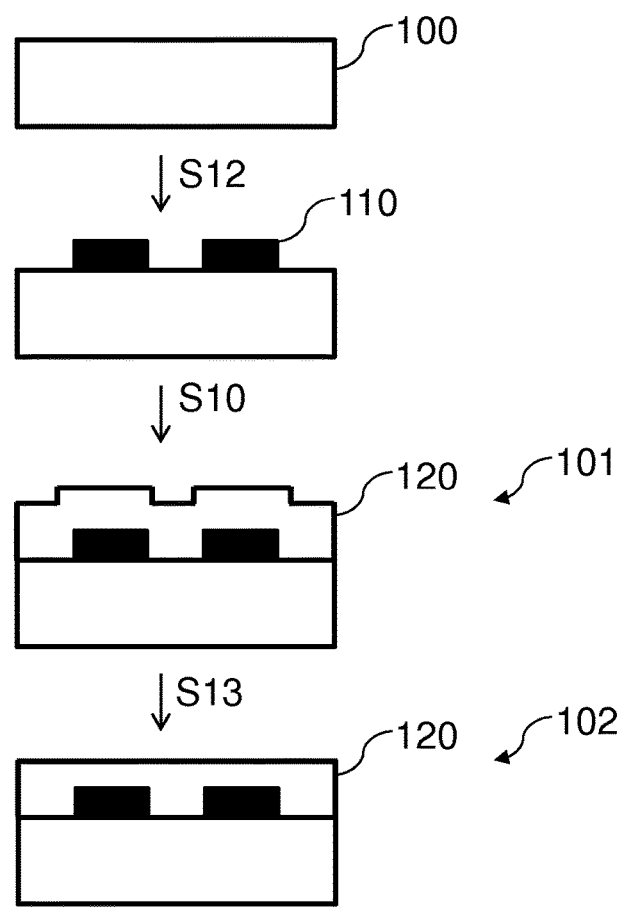
FIG. 1B schematically illustrates the fabrication method of a SAW device with a dielectric overlay layer according to the state of the art.

Hereby, the dielectric layer 220 may be made of a material chosen among the group of materials of $SiO_2$, SiN, SiON, SiOC, SiC, DLC, alumina or any kind of high k dielectric. The dielectric layer 220 may be provided as a single crystal layer of one of the above-mentioned dielectric materials or, more generally, can be comprised in a dielectric structure as will be explained below, in particular, with respect to FIG. 5. For instance, a thermally grown oxide could be formed on a silicon wafer, but also techniques like, for instance, CVD or PVD, can be envisaged, and that even at high temperatures, as will become clear below. The etching step S21 depends on the material of the dielectric layer 220, and can comprise etching techniques chosen among dry or wet chemical etching, plasma etching or reactive ion etching, or any combination of them. The pattern of the etched and non-etched parts of the etched dielectric layer 221 can be obtained by any suitable masking or lift off process, for instance, the use of a mechanical mask or the use of lithographic means. The pattern of the etched parts can have the form of the interdigitated structure, as schematically illustrated in FIG. 6B by the interdigitated electrode structure 611. The metallization step S22 can be performed using any suitable deposition technique, for instance, vacuum metallization, sputtering, electroplating techniques, PVD, CVD or ALD. With respect to the prior art approach schematically shown in FIG. 1B, the temperatures employed during the metallization step S12 are generally rather low in the range of up to 300° C. Materials used for the metalized parts may be Au, Pt, Cu, Al, Mo, or W, or any other metal. The prior art approach is thus limited to low temperatures for the formation of the dielectric layer 120. In contrast to that, there is no limitation for the providing of the dielectric layer 220 in accordance with this disclosure, and the metallization step S22 can be performed with much more flexibility with respect to the deposition technique and the deposition temperature. The interface between the dielectric layer 220 and the metalized parts 210 plays an essential role as pointed out with respect to the prior art approach of FIG. 1B, as growth defects contribute to parasitic effects and diminish the device performance. The embodiments in accordance with this disclosure, however, allow the perfect control of a high quality interface due to the fact that precise control of the etching step S21 can be obtained together with very good control of the metallization step S22, known from semiconductor technology. Further the dielectric layer 220 is no longer limited in its thermal budget, a thermally grown oxide of silicon, elaborated by dry oxidization at temperatures higher than 850° C. and up to 1200° C. or higher, has much better acoustic properties than an $SiO_2$ layer grown at low temperature by conventional techniques, due to its increased density and homogeneity. For $SiO_2$ layers deposited by low pressure CVD around 450° C., a densification of the layer is required and is obtained by an annealing step at temperatures of about 800° C. to 900° C. in ambient nitrogen. The metalized dielectric layer structure 231 obtained after the metallization step S22 is further bonded to the piezoelectric structure 200, thus forming the SAW device 20. A direct bonding (i.e., by molecular adhesion) is preferred as it provides more compatibility with typical integrated circuit processing, minimizes contamination, and offers long-term stability of the bonding between the metalized dielectric layer structure 231 and the piezoelectric structure 200. Prior to the bonding step S24, the surface of the metalized dielectric layer structure 231 comprising the metalized parts 210 can be prepared for the bonding, for instance, by chemical mechanical polishing or any other surface treatment technique, in order to sufficiently decrease the surface roughness. This leads to a much lower number of defects at the bonding interface between the metalized dielectric layer structure 231 and the piezoelectric structure 200, these defects negatively influencing the acoustic wave propagation close to or along that interface, which is a non-negligible performance factor for SAW devices.

The embodiment of SAW device 30 illustrated in FIG. 3 differs from the embodiment illustrated in FIG. 2 in that it further comprises an intermediate passivation step S39. During the passivation step S39, a passivation layer 322 is conformally formed within the etched parts of the etched dielectric layer 321, the latter obtained after performing the etching step S31 on the dielectric structure 360 comprising dielectric layer 320. Due to this passivation step S39, the corrosion resistance of the subsequently formed metalized parts 310 by metallization step S32 is increased, leading to corrosion-resistant passivated dielectric layer structure 331. For instance, a thin layer of aluminum oxide could be applied directly by means of sputtering, for example, or, alternatively, by applying a thin aluminum layer and then converting it to the corresponding aluminum oxide by means of oxidation. Other alternative materials for the passivation layer 322 may be TiN, TaN, or $Ta_2O_5$. As an alternative, a thin gold layer can fulfill the corrosion resistance requirements and, in addition, can serve as a starting point of an electrical connection to the exterior, especially as a basic material for subsequent bumping. After the formation of the metalized dielectric layer structure 331, the metalized dielectric layer structure 331 is assembled on a piezoelectric structure 300, in particular, via a bonding step S34, and, thus, forms the SAW device 30.

Figure 4:
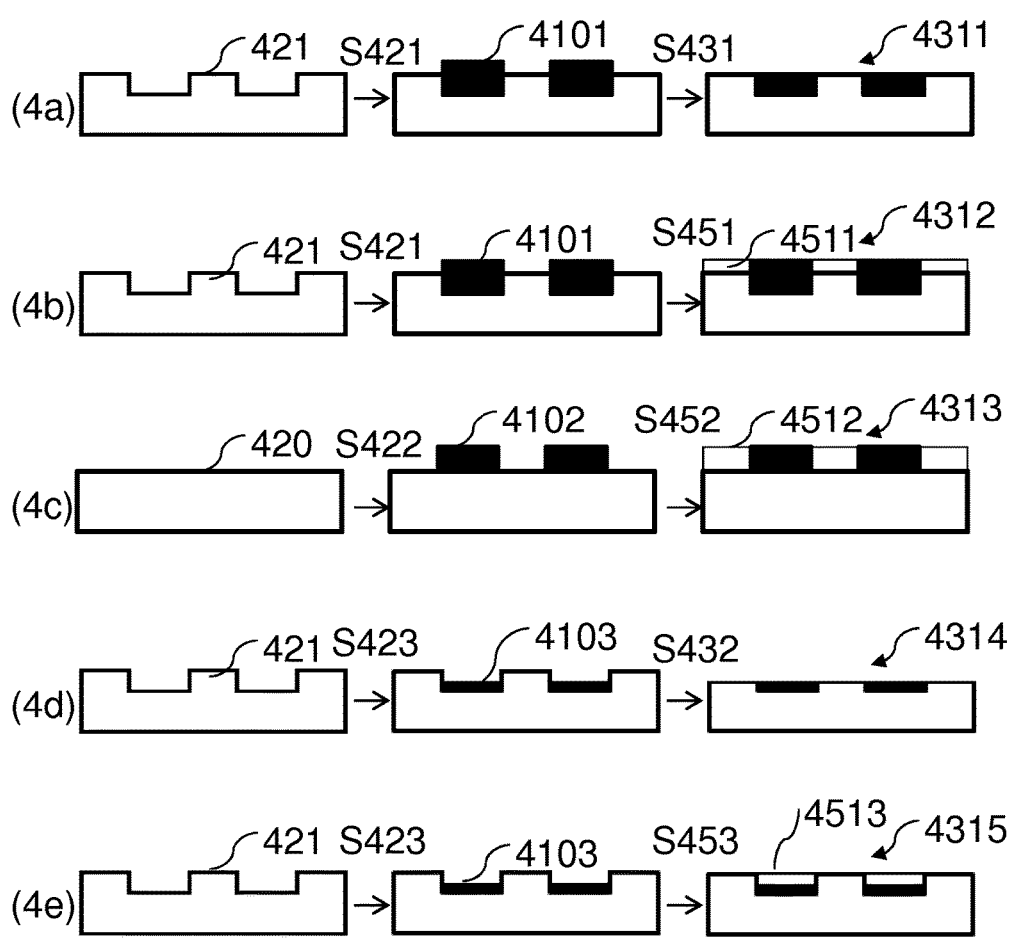

FIG. 4 schematically illustrates several embodiments in accordance with this disclosure, starting from either the initial dielectric layer 420 or the already etched dielectric layer 421 and resulting in metalized dielectric layer structures 4311 to 4315 following alternative processes (4a) to (4e) in addition to the already described modes. All alternatives aim a plane surface prepared for the subsequent bonding step S24, S34, either by planarization of protruding parts or by adding material in flush manner. As already mentioned, the dielectric layer 420 or also the metalized dielectric layer structures 4311 to 4315 may be generally comprised in a dielectric structure or metalized dielectric structure, respectively, as will be pointed out below with respect to FIG. 5 or has already been described by FIG. 2 and FIG. 3.

Alternative (4a) of FIG. 4 schematically illustrates the metallization step S421 resulting in protruding parts of metalized parts 4101 at the placing of the etched parts of the etched dielectric layer 421. A subsequent planarization step S431 using etching or polishing techniques, for instance, chemical mechanical polishing or other already above-mentioned techniques with respect to FIG. 2, results in a metalized dielectric layer structure 4311 prepared for bonding, which has a flush plane surface, in particular, with a low defect density, as already mentioned before.

Alternative (4b) of FIG. 4 schematically illustrates the metallization step S421, resulting in protruding parts of the metalized parts 4101, followed by a leveling step S451, resulting in the formation of a leveling layer 4511 flush with the protruding parts of the metalized parts 4101. The leveling layer 4511 can either be made of a dielectric material, a piezoelectric material, or a ferroelectric material. Of particular interest is a leveling layer 4511 leading to an electrochemical factor K2 larger in the vicinity of the bonding interface than would be obtained by an interface between the dielectric material of the etched dielectric layer 421 directly interfacing with the piezoelectric structure 200 illustrated in FIG. 2, resulting in metalized dielectric layer structure 4312. Large K2 can be useful to obtain wide passband width, low insertion losses and wide duplex gap. The leveling layer 4511 can, therefore, be made of materials, such as, for example, lead zirconate titanate (PZT) or other lead-containing ferro- or piezoelectric materials, such as, for instance, lead titanates PZN-xPT, PMN-xPT or PSN-xPT or also perovskite relaxor ferroelectric oxides like $Pb(Mg_xTi_{1-x})O_3$, or lead-free materials, such as, for instance, potassium niobate (KNO) or other lead-free ferro- nr piezoelectric materials like, for instance, barium strontium titanate (BST).

The alternative (4c) of FIG. 4 illustrates a metallization step S422 performed on the dielectric layer 420, resulting in metalized parts 4102 on top of the surface of the dielectric layer 420. A leveling step S452 similar to the leveling step S451 of alternative (4b) is subsequently used in order to obtain the metalized dielectric layer structure 4313, the material of the leveling layer 4512 can be chosen as described with respect to alternative (4b) before. The alternative (4c) has the advantage that no etching step has to be performed, thus reducing manufacturing efforts.

The alternative (4d) of FIG. 4 illustrates a metallization step S423 performed on the etched dielectric layer 421, resulting in metalized parts 4103 not completely filling up the etched parts of the etched dielectric layer 421. A further planarization step S432 is used to remove the protruding parts of the etched dielectric layer 421, leaving behind a flush surface of the metalized dielectric layer structure 4314. This alternative (4d) has the advantage that planarization step S432 not only leads to a flush surface between the etched dielectric layer 421 and the metalized parts 4103, but at the same time prepares that surface, which will be the bonding interface to a piezoelectric structure and, thus, wave propagation along this interface will become important, so that the density of interface traps, which are electrically active and thus sensitive to wave propagation inducing insertion losses, less than $1 \times 10^{12}$ cm$^{-2}$ or even $1 \times 10^{10}$ cm$^{-2}$ or lower is obtained, and a surface roughness of less than 5 nm or even 1 nm can be achieved. For the planarization step S432, the already-mentioned techniques of etching and polishing related to other embodiments can be used.

Alternative (4e) of FIG. 4 illustrates the metallization step S423 performed on the etched dielectric layer 421 similar to alternative (4d), resulting in a non-flush surface that has protruding parts of the etched dielectric layer 421. Subsequently, a leveling step S453 is performed in order to fill up the remaining space between the protruding parts of the etched dielectric layer 421 and the metalized parts 4103 with a leveling layer 4513. The material of the leveling layer 4513 formed on top of the metalized parts 4103 is preferably electrically conductive, in particular, a deposited metal. That leveling layer 4513 can be of metallic type and be deposited as described for the other metallization steps related to other embodiments. The resulting metalized dielectric layer structure 4315 can, in particular, comprise a double layer of metal, with the metalized parts 4103 covered with another leveling layer 4513 of metallic type. Such a configuration has the advantage that mass loading can be obtained by the use of much heavier metals, such as, for instance, Mo, Cu or W, covered by lighter metals such as Au, Al, or Pt, or vice versa. Such a double metallization can be used to reduce the thickness of the surrounding dielectric material necessary for compensation of temperature changes of the frequency of the SAW device. Further, the use of different metal stacks allows the balance performance between insertion losses due to resistivity and power handling capability.

Figure 5:
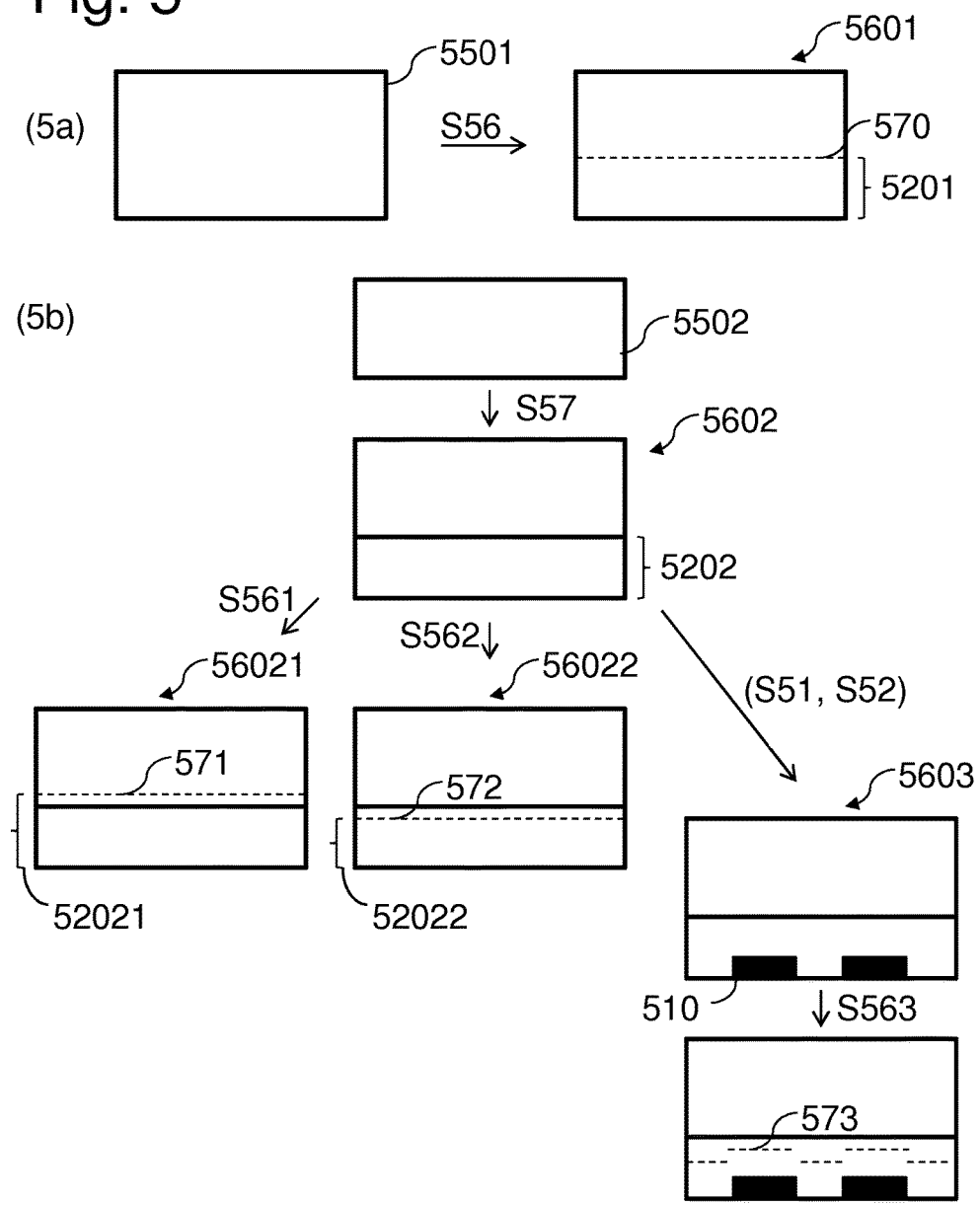

FIG. 5 schematically illustrates several alternative modes of realization concerning the comprised step of providing a dielectric layer of the fabrication process of a SAW device in accordance with this disclosure. The dielectric layer 220, 320, 420 can be replaced by any of dielectric layers 5201, 5202, 52021, 52022, and the alternative processes (5a) and (5b) of FIG. 5 can be easily included in the fabrication process of the SAW device as will be described in the following paragraphs.

The alternative (5a) illustrates that a step S56 for forming a zone of weakness can be performed on a bulk donor substrate 5501, resulting in a zone of weakness 570 and the dielectric layer 5201 within the bulk donor substrate 5501, thus forming a dielectric structure 5601. Detaching of the dielectric layer 5201 along the zone of weakness 570 can be obtained by application of thermal or mechanical stress. The step S56 for forming a zone of weakness can be performed by homogeneous implantation of ionic gaseous species, in particular, H or He, or a combination, with reference to the well-known SMARTCUT® technology. The detaching can be performed after performing the other fabrication steps described with respect to FIG. 2, for instance, the etching step S21, the metallization step S22, and the bonding step S24. The remaining part of the dielectric structure 5601 can be reused as new bulk donor substrate. Bulk donor substrate 5501 can be used with any bulk material of the already-mentioned dielectric materials with reference to FIG. 2, in particular, single crystal bulk materials, for instance, of high k materials.

The alternative (5b) illustrates that a formation step S57 is performed on a donor substrate 5502, resulting in a dielectric structure 5602 comprising a dielectric layer 5202. The formation step S57 can be the growth of a dielectric material, for instance, by CVD, PVD or ALD, or the formation of a dielectric by oxidation, such as, for instance, formation of a thermally grown oxide of silicon obtained by annealing in an oxygen-containing ambient, or also the transfer of a dielectric layer from another substrate to the donor substrate 5502, as could be the case by application of the SMARTCUT® process to any of the already-mentioned dielectric materials, for instance, SMARTCUT® of a high k dielectric from its bulk single crystal material. Once that dielectric structure 5602 comprising the dielectric layer 5202 is obtained, several alternatives exist to include it into the fabrication process of the SAW device. One alternative is, as already pointed out in alternative (5a), that the formation of a zone of weakness 571, 572 can be obtained by performing a step 5561, 5562 for forming a zone of weakness, resulting in dielectric structures 56021 and 56022 with respective dielectric layers 52021 and 52022, depending on whether the zone of weakness 571, 572 is formed within the part of the dielectric structure 5602 consisting of donor substrate 5502 or within the part of the dielectric structure 5602 consisting of dielectric layer 5202. Both of these alternatives have the advantage that the formation of the zone of weakness 571, 572 can be performed before the subsequent steps of etching, metallization, and bonding to a piezoelectric structure and, thus, detaching along the zone of weakness leads to a flat top surface of the respective final SAW device.

Another alternative to include the dielectric structure 5602 in the fabrication process of the SAW device is to perform the etching step S51 and the metallization step S52 before the subsequent step 5563 for forming a zone of weakness, resulting in metalized dielectric structure 5603, for instance, by implantation as mentioned before through surface 510. The penetration depth of implantation depends on the energy used for implantation and the material in which it is implanted and, thus, implantation performed on the metalized dielectric structure 5603 results in a profiled zone of weakness 573. Detaching along the zone of weakness 573 after bonding to a piezoelectric structure results in a final SAW device with a convex top surface, which might be advantageous for certain applications.

Figure 6A:
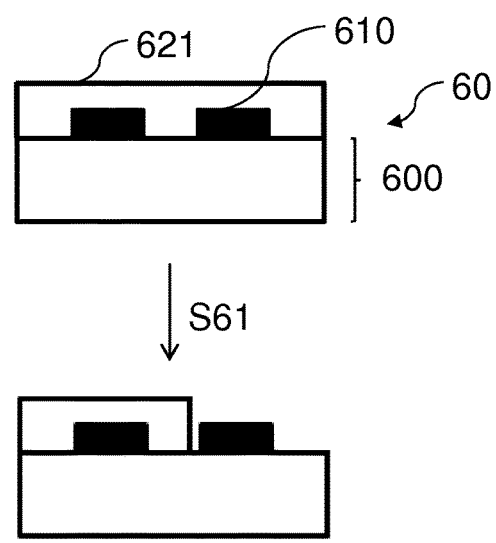
Figure 6B:
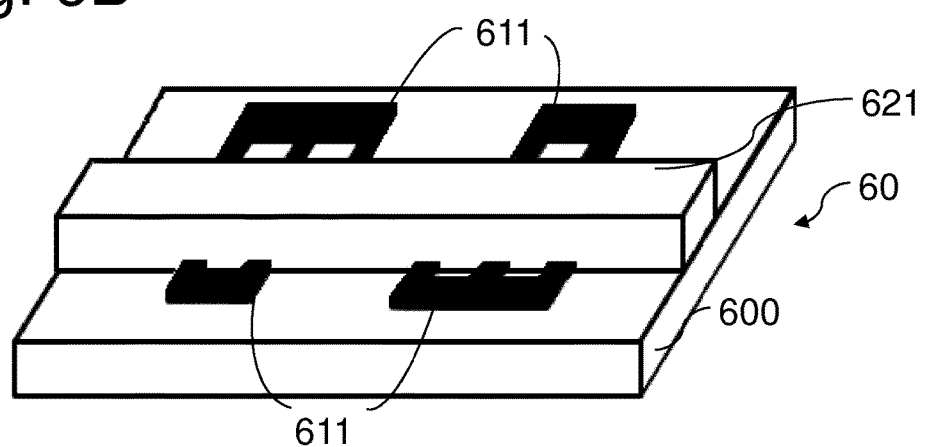

FIGS. 6A and 6B further schematically show the step S61 of laying open of the metalized parts 610 or, respectively, the interdigitated electrode structure 611 and the thus obtained fully electrically addressable SAW device 60 comprising an etched dielectric layer 621, the metalized parts 610 or interdigitated electrode structure 611 with the etched parts of the etched dielectric layer 621, on a piezoelectric structure 600. The laying open can be performed by dry or wet chemical etching, reactive ion etching or plasma etching, together with masking and or use of lithographic means. The pattern of the interdigitated electrode structure 611 used for the metalized parts 210 to 610 has a direct influence on the frequency at which the SAW device works, through its spacing S, illustrated schematically in FIG. 1A. The spacing S also influences the breakdown voltage of the SAW device, which also depends on the material of the etched dielectric layer 221 in which the metalized parts 210 are embedded. This disclosure gives much more flexibility in the choice of that dielectric material, in particular, the use of high k dielectrics is possible. Breakdown voltages as high as 50 V, or even as high as 100 V, can be achieved, allowing handling powers higher than 2.5 W or even higher than 5 W, and that for spacing S, less than 4 µm down to 0.2 µm, leading to SAW devices useable for high-power applications. One skilled in the art would know how to adapt the dielectric material and the spacing S depending on the envisaged breakdown voltage for high-power applications.

The invention claimed is:

1. A method of fabrication of a surface acoustic wave device comprising:
   providing a piezoelectric structure;
   providing a dielectric structure and metalizing the dielectric structure; and bonding the metalized dielectric structure to the piezoelectric structure;
wherein metalizing the dielectric structure further comprises:
   locally etching cavities in a surface of the dielectric structure; and
   depositing metal in the cavities; and
wherein metalizing the dielectric structure is performed by metal deposition and providing a dielectric structure comprises forming a dielectric layer prior to the metal deposition at a formation temperature, the formation temperature being greater than the diffusion temperature of the deposited metal in either the dielectric layer or the piezoelectric structure.

2. The method according to claim 1, wherein metalizing the dielectric structure is performed so as to form an interdigitated electrode structure.

3. The method according to claim 2, wherein the interdigitated electrode structure has a spacing lower than 100 nm, and the dielectric structure exhibits a dielectric constant suitable for allowing a breakdown voltage of higher than 100 V.

4. The method according to claim 1, wherein the deposited metal is chosen among the group of Au, Pt, Cu, Al, Mo, W.

5. The method according to claim 1, wherein the dielectric structure comprises a dielectric layer, the dielectric layer being made of a material chosen from the group of materials consisting of $SiO_2$, SiN, SiON, SiOC, SiC, DLC, and alumina.

6. The method according to claim 1, wherein the dielectric structure comprises a dielectric layer, the dielectric layer comprising a thermally grown silicon oxide formed at temperatures higher than 800° C.

7. The method according to claim 1, wherein the dielectric structure comprises a dielectric layer, the dielectric layer comprising a high k dielectric material.

8. The method according to claim 1, wherein metalizing the dielectric structure further comprises forming a passivation layer prior to depositing metal in the cavities and after locally etching cavities in the surface of the dielectric structure.

9. The method according to claim 1, wherein metalizing the dielectric structure further comprises providing a flush surface between the metal deposited in the cavities and non-etched parts of the dielectric structure, the providing of the flush surface being performed by polishing and/or etching of a protruding part of either the dielectric structure or the deposited metal.

10. The method according to claim 1, wherein providing the dielectric structure further comprises providing a leveling layer in a flush manner to either the protruding part of the deposited metal or the protruding part of the dielectric structure.

11. The method according to claim 1, wherein the dielectric structure comprises:
   a donor substrate; and
   a dielectric layer formed on the donor substrate, the method further comprising transferring the dielectric layer onto the piezoelectric structure after providing the dielectric structure.

12. The method according to claim 11, wherein providing the dielectric structure comprises forming a zone of weakness in either the donor substrate or the dielectric layer prior to bonding the metalized dielectric structure to the piezoelectric structure, and transferring the dielectric layer onto the piezoelectric structure comprises detaching the dielectric layer from the donor substrate at the zone of weakness after bonding the metalized dielectric structure to the piezoelectric structure.

13. The method according to claim 11, wherein transferring the dielectric layer onto the piezoelectric structure comprises polishing and/or etching of the donor substrate after bonding the metalized dielectric structure to the piezoelectric structure.

14. The method according to claim 1, further comprising laying open at least part of the metalized dielectric structure after bonding the metalized dielectric structure to the piezoelectric structure.

15. The method of claim 1, wherein the formation temperature is greater than 350° C.

16. The method of claim 15, wherein the formation temperature is greater than 850° C.

* * * * *

UNITED STATES PATENT AND TRADEMARK OFFICE
CERTIFICATE OF CORRECTION

PATENT NO. : 10,270,413 B2  
APPLICATION NO. : 14/782548  
DATED : April 23, 2019  
INVENTOR(S) : Christophe Zinke and Eric Desbonnets Page 1 of 1

It is certified that error appears in the above-identified patent and that said Letters Patent is hereby corrected as shown below:

In the Specification

| | | |
|---|---|---|
| Column 2, | Line 49, | change "step (bl) of" to --step (b1) of-- |
| Column 8, | Lines 37,38 | change "ferro- nr piezoelectric" to --ferro- or piezoelectric-- |
| Column 10, | Line 8, | change "step 5561, 5662" to --step S561, S662-- |
| Column 10, | Line 24, | change "step 5563 for" to --step S563 for-- |

Signed and Sealed this  
Second Day of July, 2019

Andrei Iancu  
*Director of the United States Patent and Trademark Office*